United States Patent
Sonoda

(10) Patent No.: US 10,003,017 B2
(45) Date of Patent: Jun. 19, 2018

(54) ETCHING APPARATUS AND ETCHING METHOD

(71) Applicant: TOSHIBA MEMORY CORPORATION, Minato-ku, Tokyo (JP)

(72) Inventor: Yasuyuki Sonoda, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 520 days.

(21) Appl. No.: 14/638,731

(22) Filed: Mar. 4, 2015

(65) Prior Publication Data
US 2016/0087195 A1    Mar. 24, 2016

Related U.S. Application Data

(60) Provisional application No. 62/052,312, filed on Sep. 18, 2014.

(51) Int. Cl.
| | | |
|---|---|---|
| B44C 1/22 | (2006.01) | |
| C03C 15/00 | (2006.01) | |
| C03C 25/68 | (2006.01) | |
| C23F 1/00 | (2006.01) | |
| H01L 43/12 | (2006.01) | |
| H01J 37/32 | (2006.01) | |
| H01L 43/02 | (2006.01) | |

(52) U.S. Cl.
CPC ........ *H01L 43/12* (2013.01); *H01J 37/32357* (2013.01); *H01J 37/32422* (2013.01); *H01J 37/32715* (2013.01); *H01L 43/02* (2013.01); *H01J 2237/20207* (2013.01); *H01J 2237/20214* (2013.01); *H01J 2237/3151* (2013.01)

(58) Field of Classification Search
USPC ........................................................... 216/66
See application file for complete search history.

(56) References Cited

U.S. PATENT DOCUMENTS

| | | | | |
|---|---|---|---|---|
| 6,329,211 B1 * | 12/2001 | Terunuma | ............. | G11B 5/3116 29/603.15 |
| 7,329,362 B2 * | 2/2008 | Cyrille | ................... | B82Y 10/00 216/22 |
| 2007/0238031 A1 * | 10/2007 | Lee | ..................... | H01L 21/0337 430/5 |
| 2013/0001714 A1 * | 1/2013 | Nishiyama | .............. | G11C 11/16 257/421 |
| 2013/0316536 A1 * | 11/2013 | Seto | .................... | H01L 21/2633 438/689 |
| 2014/0144873 A1 | 5/2014 | Yoshida et al. | | |

FOREIGN PATENT DOCUMENTS

JP        2013197524 A        9/2013

\* cited by examiner

*Primary Examiner* — Roberts Culbert
(74) *Attorney, Agent, or Firm* — Holtz, Holtz & Volek PC

(57) ABSTRACT

According to one embodiment, an etching apparatus includes an etching chamber, a stage in the etching chamber, a plasma generator in the etching chamber, the plasma generator being opposite to the stage and irradiating an ion beam toward the stage, a supporter supporting the stage, the supporter having a rotational axis in a direction in which the ion beam is irradiated, a first driver changing a beam angle between a direction which is perpendicular to an upper surface of the stage and the direction in which the ion beam is irradiated, and a second driver which rotates the stage on the rotational axis.

11 Claims, 20 Drawing Sheets

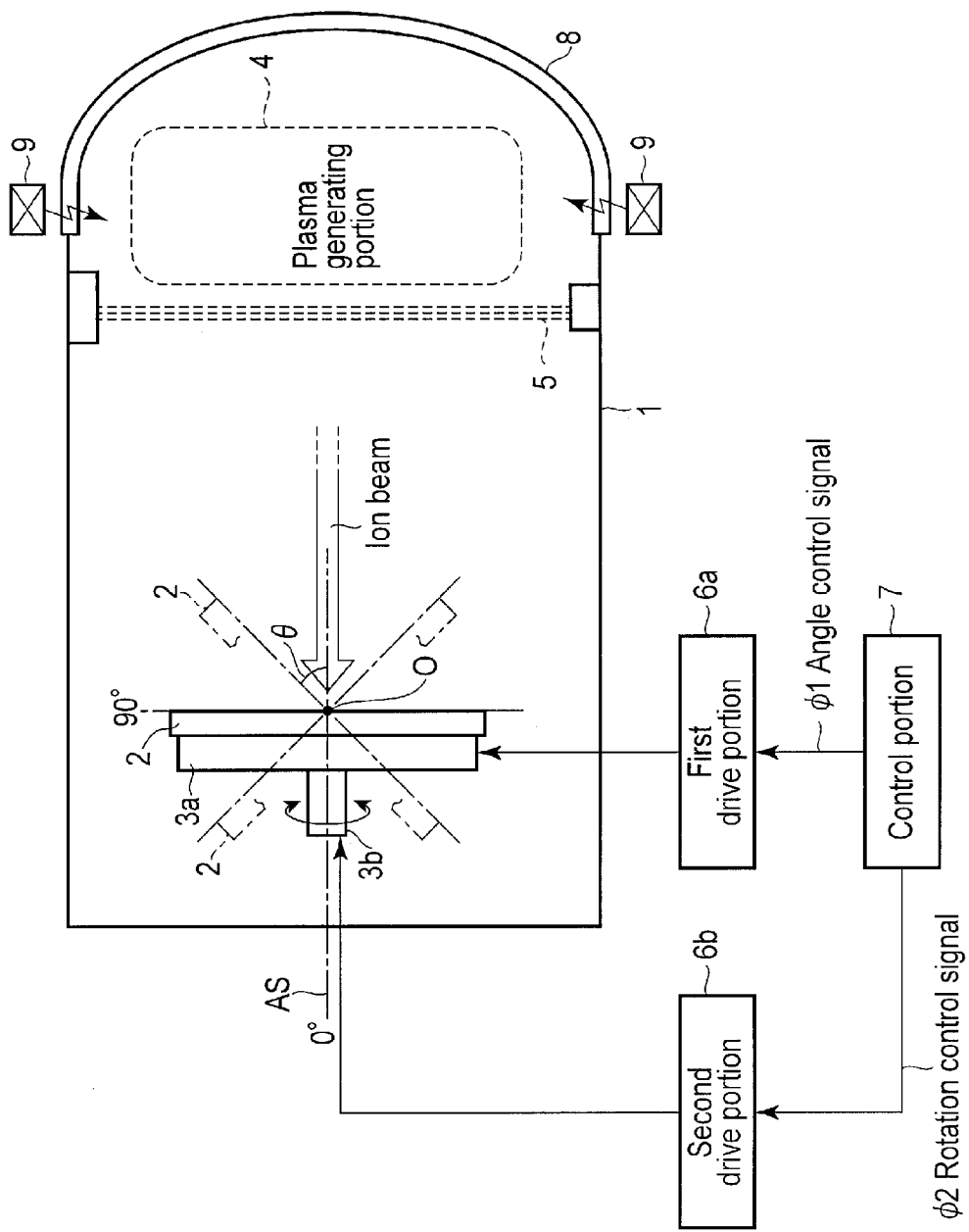
F I G. 1

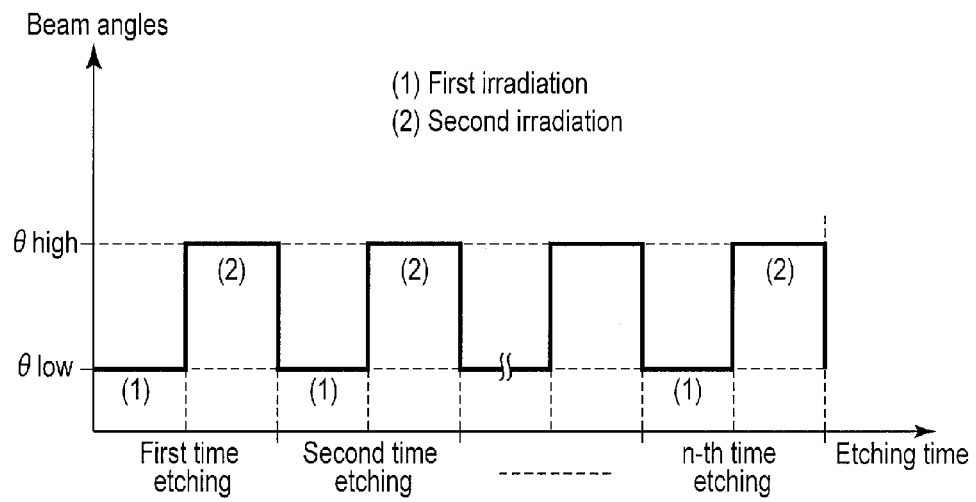
F I G. 3A
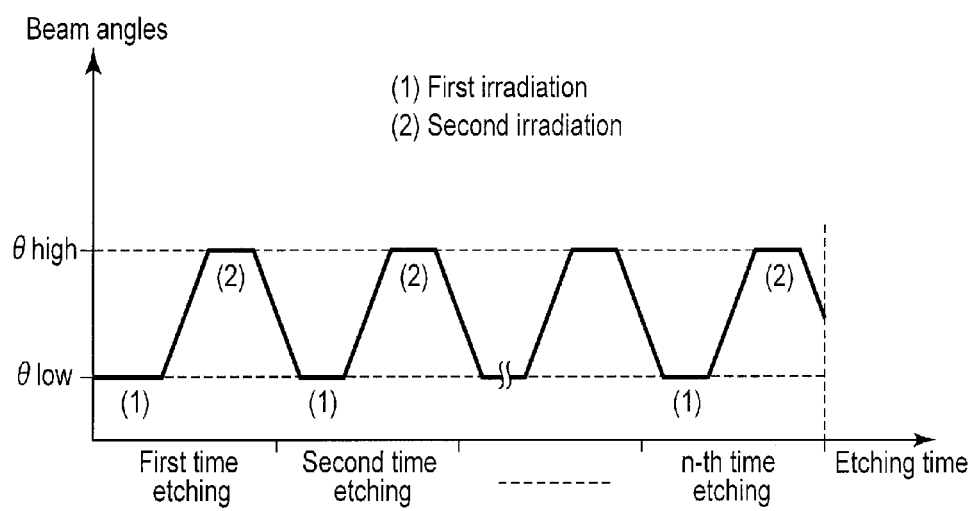
F I G. 3B

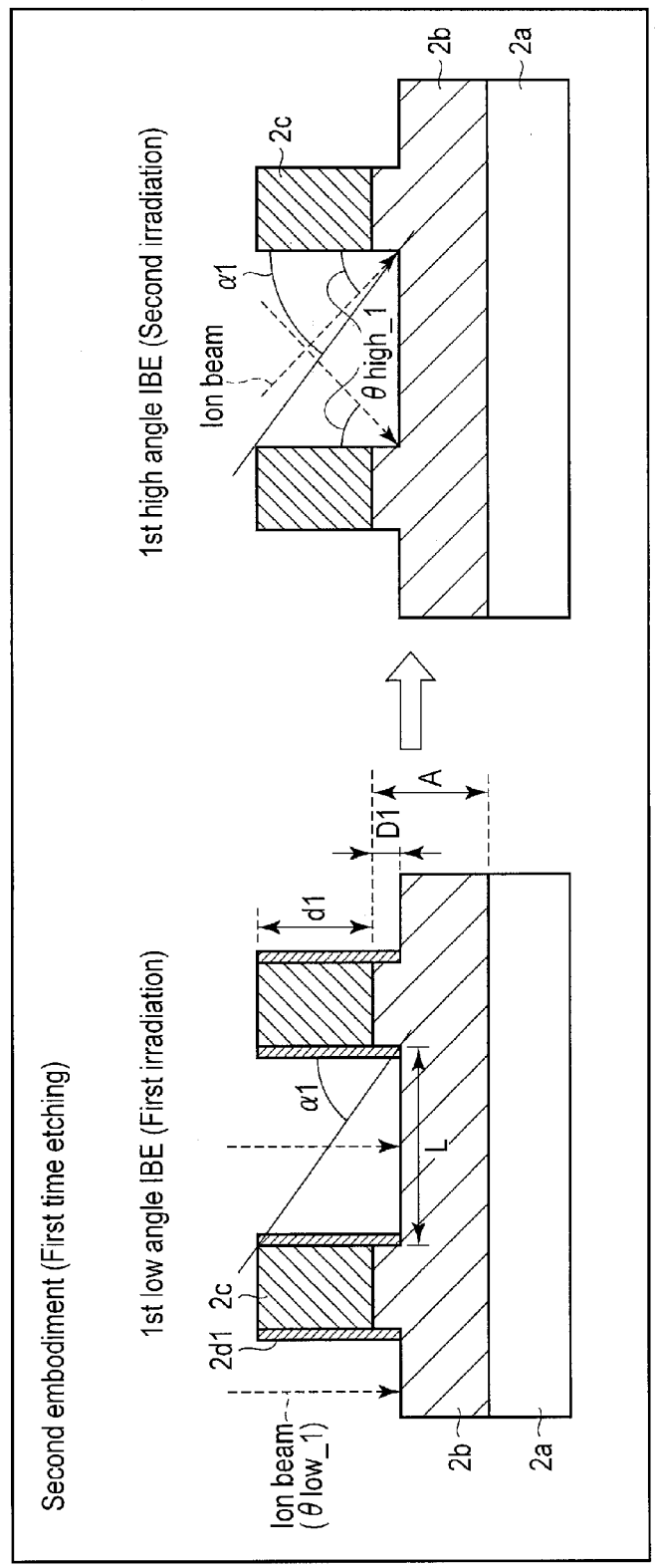
F I G. 8

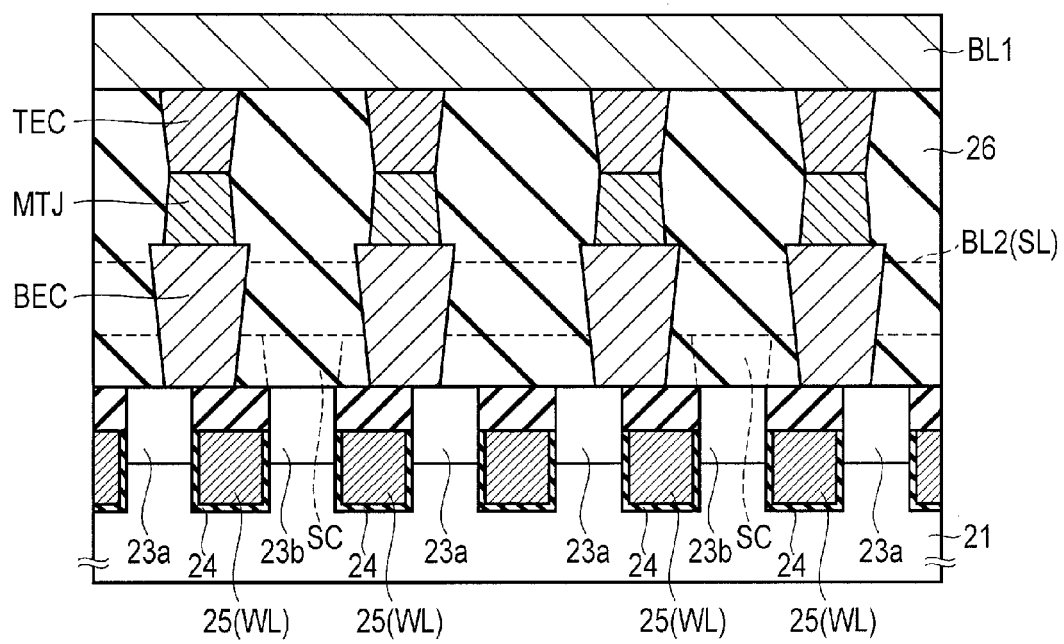
F I G. 13
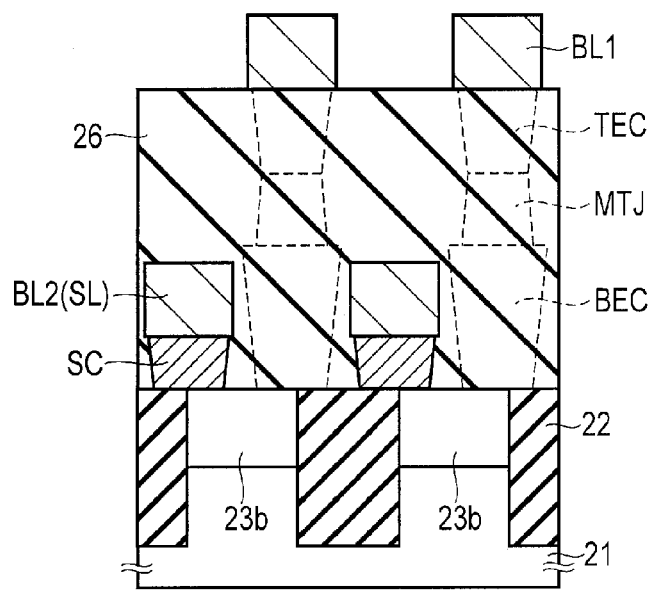
F I G. 14

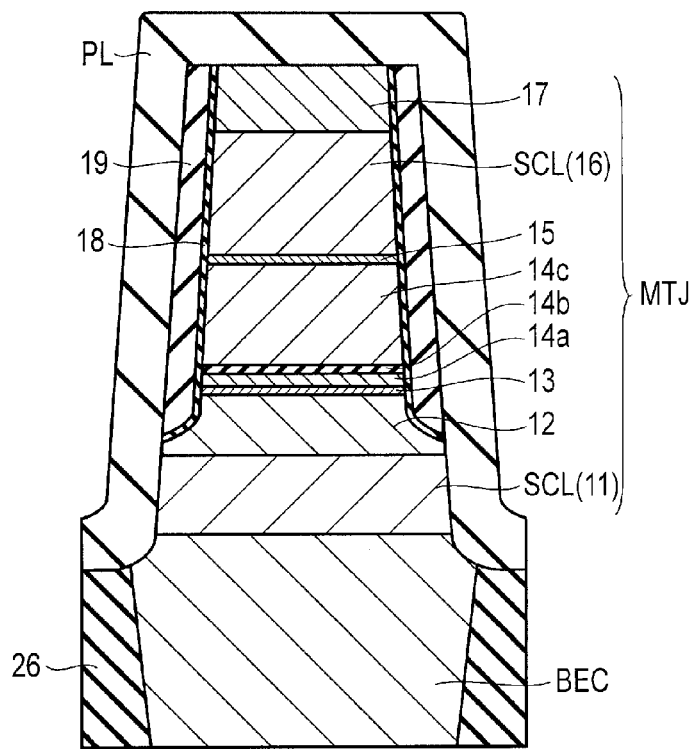
F I G. 15
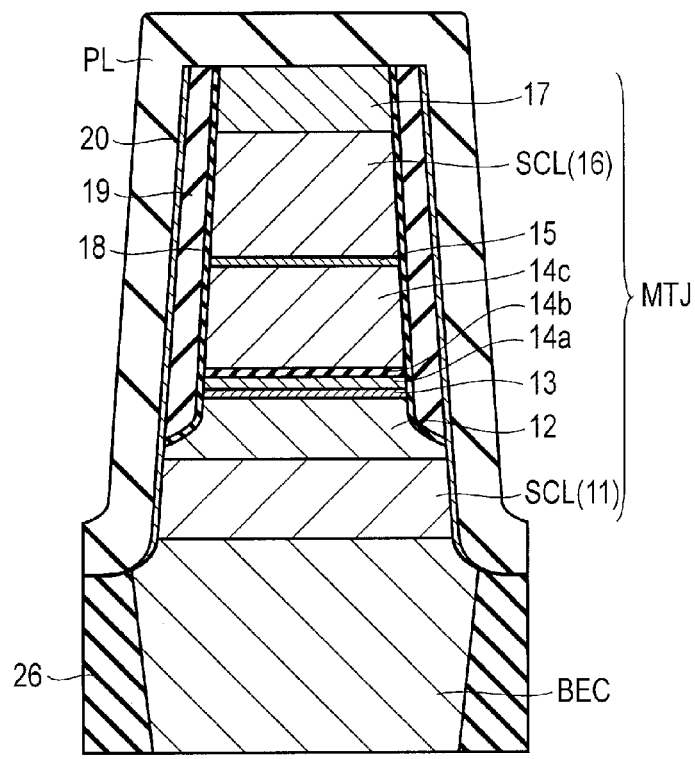
F I G. 16

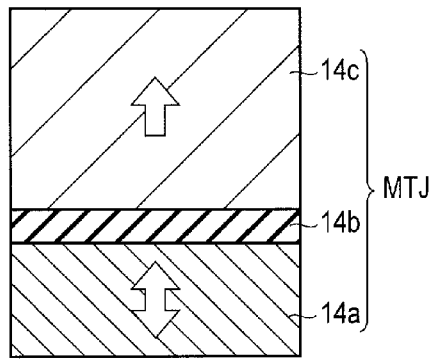
F I G. 17A
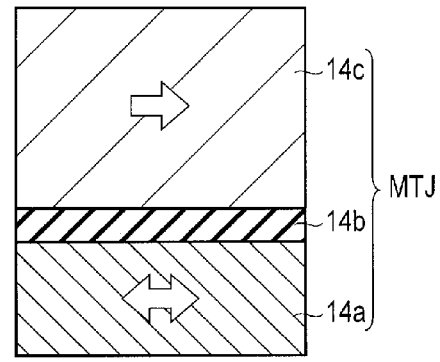
F I G. 17B
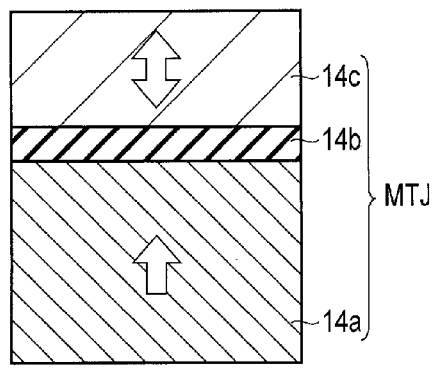
F I G. 18A
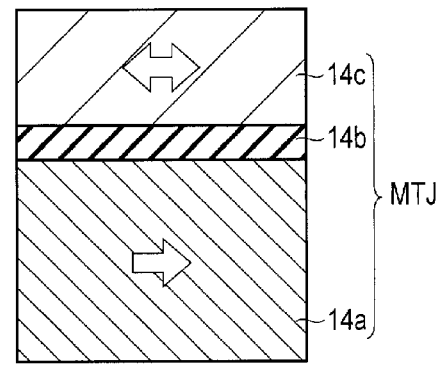
F I G. 18B

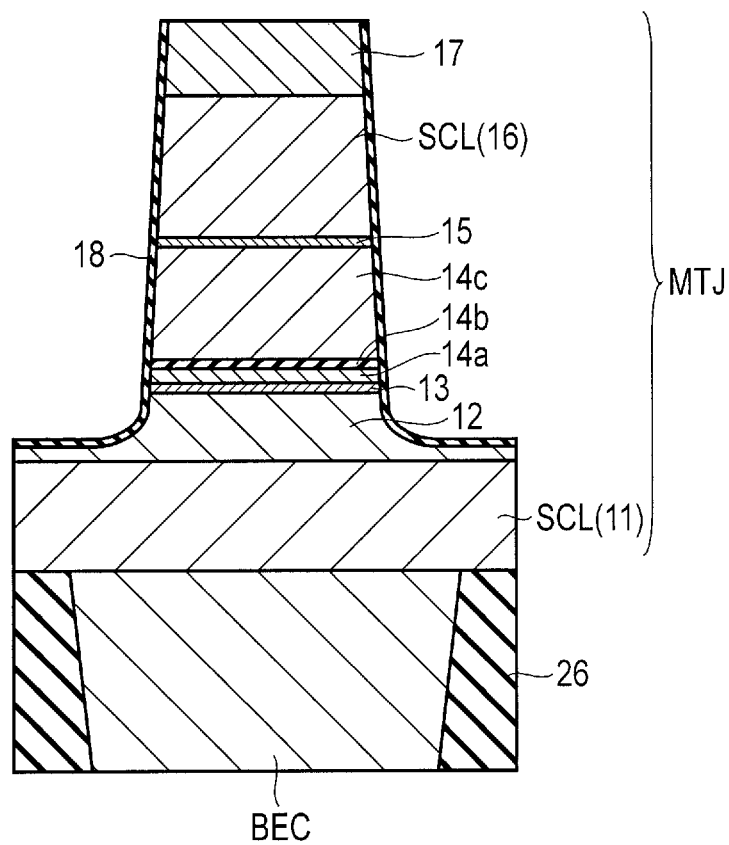
F I G. 21

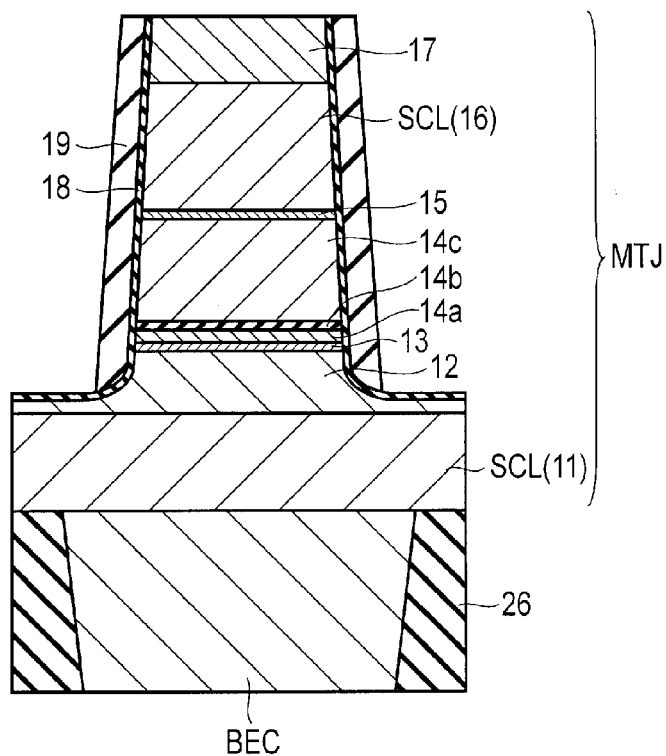
F I G. 22
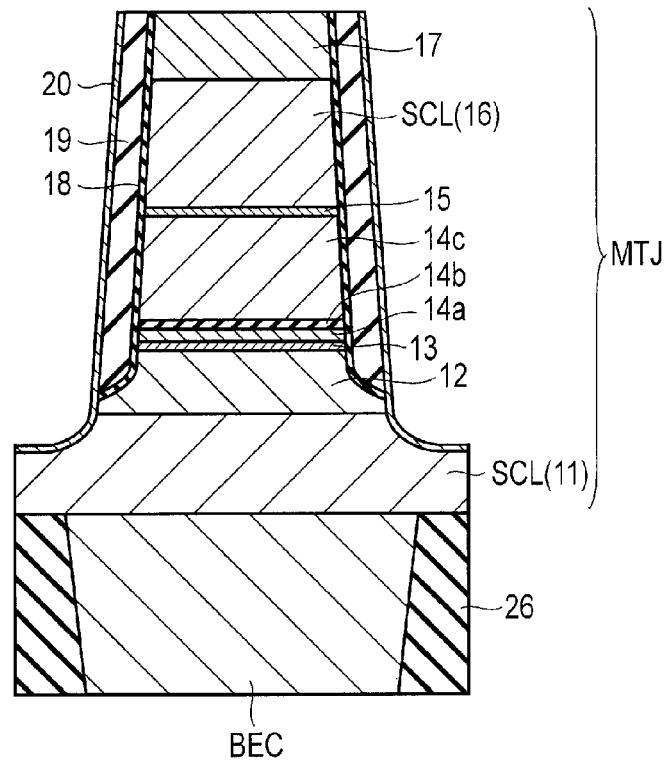
F I G. 23

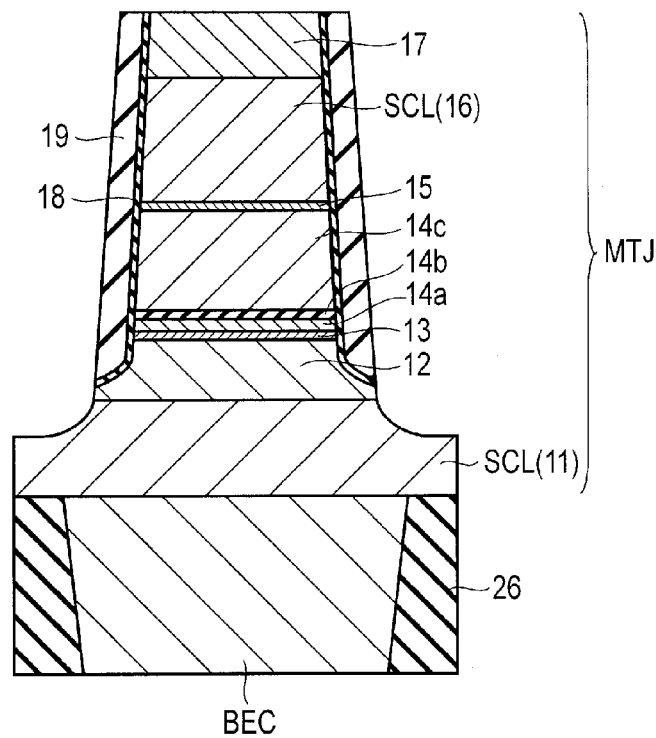
F I G. 24
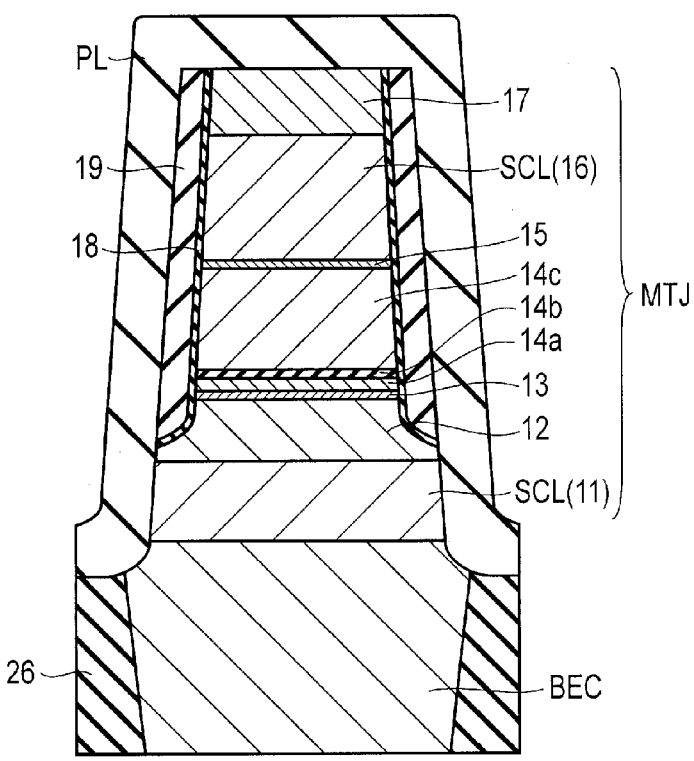
F I G. 25

ETCHING APPARATUS AND ETCHING METHOD

CROSS-REFERENCE TO RELATED APPLICATIONS

This application claims the benefit of U.S. Provisional Application No. 62/052,312, filed Sep. 18, 2014, the entire contents of which are incorporated herein by reference.

FIELD

Embodiments described herein relate generally to an etching apparatus and an etching method.

BACKGROUND

Recently, various types of devices comprising a magnetic layer have been developed. One of the devices is a magnetic memory. For example, a spin-transfer-torque (STT) magnetic random access memory (MRAM) stores data in a magnetic layer.

These devices have a common problem. When a magnetic layer is patterned, redeposition of a magnetic material is collaterally caused. The redeposition degrades the characteristics of the devices.

BRIEF DESCRIPTION OF THE DRAWINGS

FIG. 1 shows the general outline of an etching apparatus.

FIG. 3A and FIG. 3B show examples in which a beam angle is changed.

FIG. 8 to FIG. 10 show an etching method according to a second embodiment.

FIG. 13 is a cross-sectional view taken along line XIII-XIII of FIG. 12.

FIG. 14 is a cross-sectional view taken along line XIV-XIV of FIG. 12.

FIG. 15 shows a magnetoresistive element as an application example.

FIG. 16 shows a comparative example of the magnetoresistive element.

FIG. 17A and FIG. 17B show a top-pin type magnetoresistive element.

FIG. 18A and FIG. 18B show a bottom-pin type magnetoresistive element.

FIG. 19 to FIG. 27 show examples of a method for manufacturing a magnetoresistive element.

DETAILED DESCRIPTION

Figure 2:
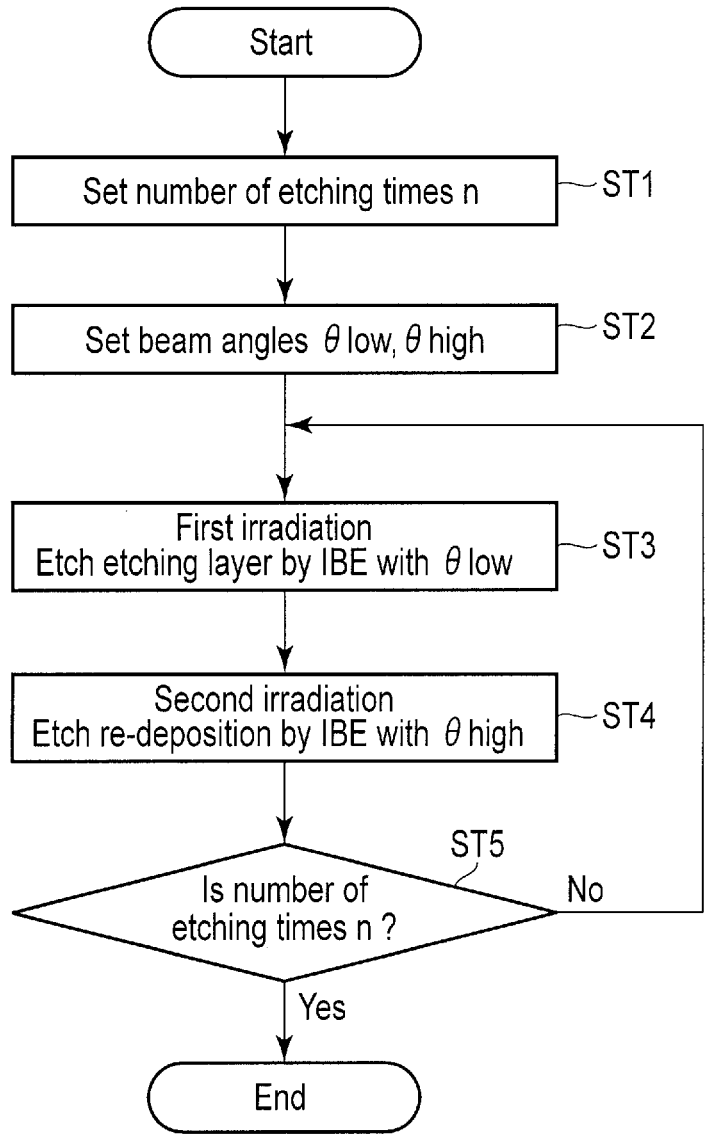
FIG. 2 shows an example of the operation of the etching apparatus of FIG. 1.

In general, according to one embodiment, an etching apparatus comprises: an etching chamber; a stage in the etching chamber; a plasma generator in the etching chamber, the plasma generator being opposite to the stage and irradiating an ion beam toward the stage; a supporter supporting the stage, the supporter having a rotational axis in a direction in which the ion beam is irradiated; a first driver changing a beam angle between a direction which is perpendicular to an upper surface of the stage and the direction in which the ion beam is irradiated; a second driver which rotates the stage on the rotational axis; and a controller which is configured to: execute a first irradiation which irradiates the ion beam with the beam angle of a first value; and execute a second irradiation which irradiates the ion beam with the beam angle of a second value different from the first value after the first irradiation.

1. Etching Apparatus

FIG. 1 shows the general outline of an etching apparatus according to an embodiment.

An etching chamber 1 is, for example, a physical etching chamber for patterning an etching layer in a wafer 2 by IBE. The wafer 2 is, for example, a substrate in which a magnetic memory (for example, an MRAM) is formed. A stage 3a is provided in the etching chamber 1 and holds the wafer 2 including the etching layer. The stage 3a is supported by a support portion (a supporter) 3b.

A direction perpendicular to the upper surface of the stage 3a (or the upper surface of the wafer 2) can be inclined at only θ with respect to a direction in which an ion beam is irradiated. In other words, the angle θ between the direction perpendicular to the upper surface of the stage 3a and the direction in which an ion beam is irradiated can be changed. The angle θ is equivalent to a beam angle, and can be changed within a predetermined angle range.

This example shows the stage 3a (solid line) when the beam angle θ is 0°, and the stage 3a (broken line) when the beam angle θ is 45°.

The support portion 3b comprises a rotational axis AS based on an O point. When the angle θ is 0°, the rotational axis AS is parallel to the direction in which the ion beam is irradiated. The support portion 3b rotates with, for example, the stage 3a inclined at the angle θ. While the ion beam is irradiated, the stage 3a and the support portion 3b serve to rotate the wafer 2. By this rotation, the wafer in-plane uniformity (σ) of the etching rate of the wafer 2 can be improved.

A plasma generating portion (a plasma generator) 4 is provided in the etching chamber 1. The plasma generating portion 4 faces a stage 3, and produces an ion which is the base of an ion beam. The plasma generating portion 4 is separated from the stage 2 by a grid 5.

The ion of the plasma generating portion 4 is drawn to the wafer 2 side via the grid 5, thereby producing an ion beam. The ion beam includes, for example, one of Ne, Ar, Kr, Xe, $N_2$ and $O_2$.

A plasma power supply window 8 is, for example, an element for producing plasma by delivering an electromagnetic wave (energy) from antenna 9 to the plasma generating portion 4. Antenna 9 has a ring shape, and surrounds the etching chamber 1.

A first drive portion (a first driver) 6a is a drive portion for adjusting the beam angle θ by rotating the stage 3a based on the O point and changing the orientation of the stage 3a. A second drive portion (a second driver) 6b is a drive portion for rotating the stage 3a based on the rotational axis AS.

A control portion (a controller) 7 controls the beam angle θ by the first drive portion 6a and controls the rotational direction and the rotational speed of the stage 3 by the second drive portion 6b.

For example, the control portion 7 conducts a first irradiation to irradiate an ion beam having a beam angle θ which is a first value to the etching layer in the wafer 2. After the first irradiation, the control portion 7 conducts a second irradiation to irradiate an ion beam having a beam angle θ which a second value different from the first value to the etching layer in the wafer 2. The control portion 7 repeats the first and second irradiations n times (n is a natural number).

In the first and second irradiations, the rotational direction and the rotational speed of the stage 3 are preferably constant. However, in the first and second irradiations, the rotational direction and the rotational speed of the stage 3 may be changed.

FIG. 2 shows an example of the operation of the etching apparatus of FIG. 1.

Figure 7:
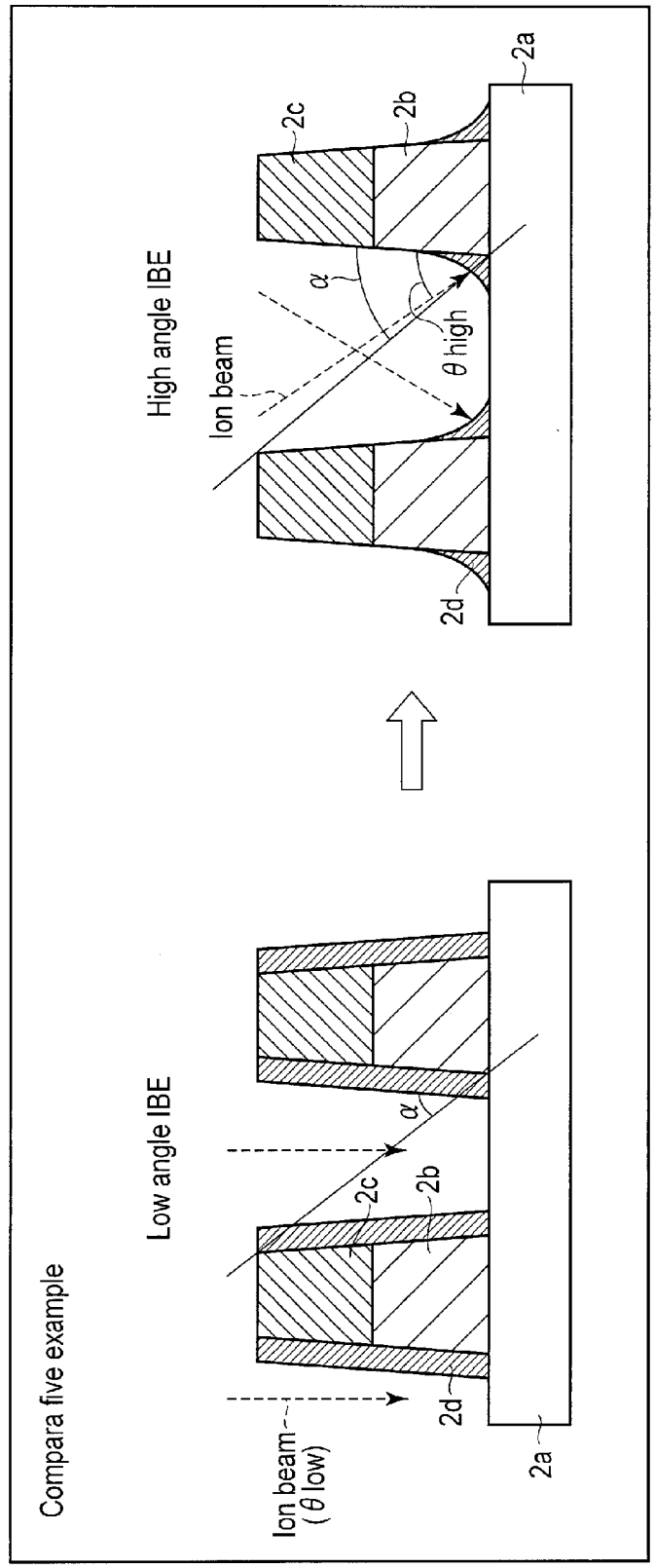
FIG. 7 shows a comparative example of the etching method.

This operation is controlled by the control portion 7 of FIG. 7.

First, the number of etching times n is set (n is a natural number greater than or equal to 2), and beam angles θlow and θhigh are set (steps ST1 to ST2).

The beam angle θlow corresponds to the first value of the beam angle θ explained in FIG. 1, and refers to a low angle. The beam angle θhigh corresponds to the second value of the beam angle θ explained in FIG. 1, and refers to a high angle which is higher than the low angle θlow.

θlow can be set for each etching time n. For example, θlow=θlow_1, θlow_2, . . . , θlow_n. θlow may be constant; in short, θlow_1=θlow_2= . . . =θlow_n.

In a similar manner, θhigh can be set for each etching time n. For example, θhigh=θhigh_1, θhigh_2, . . . , θhigh_n. θhigh may be constant; in short, θhigh_1=θhigh_2= . . . =θhigh_n.

Next, the first irradiation of ion beam is conducted. By IBE at a beam angle (low angle) θlow (=θlow_1), the etching layer (for example, a magnetic layer or a metal layer) is etched (step ST3).

In the first irradiation, redeposition of the etching layer is caused together with the etching of the etching layer.

Subsequently, the second irradiation of ion beam is conducted. By IBE at a beam angle (high angle) θhigh (=θhigh_1), the etching layer is etched while the redeposition is reduced (step ST4).

The first and second irradiations are repeated n times (step ST5).

Through the above steps, the patterning of the etching layer in the wafer 2 shown in FIG. 1 is completed.

FIG. 3A and FIG. 3B show examples in which a beam angle is changed.

In the examples, to simplify the explanation, θlow and θhigh are set to be constant with respect to each etching time n.

For example, as shown in FIG. 3A, the switching between the first irradiation (step ST3 in FIG. 2) and the second irradiation (step ST4 in FIG. 2) may be conducted based on a discrete change between the low angle θlow and the high angle θhigh with respect to the etching time. This switching is called a discontinuous switching.

As shown in FIG. 3B, the switching between the first irradiation (step ST3 in FIG. 2) and the second irradiation (step ST4 in FIG. 2) may be conducted based on a continuous change between the low angle θlow and the high angle θhigh with respect to the etching time. This switching is called a continuous switching.

2. Etching Method (1) First Embodiment

Figure 4:
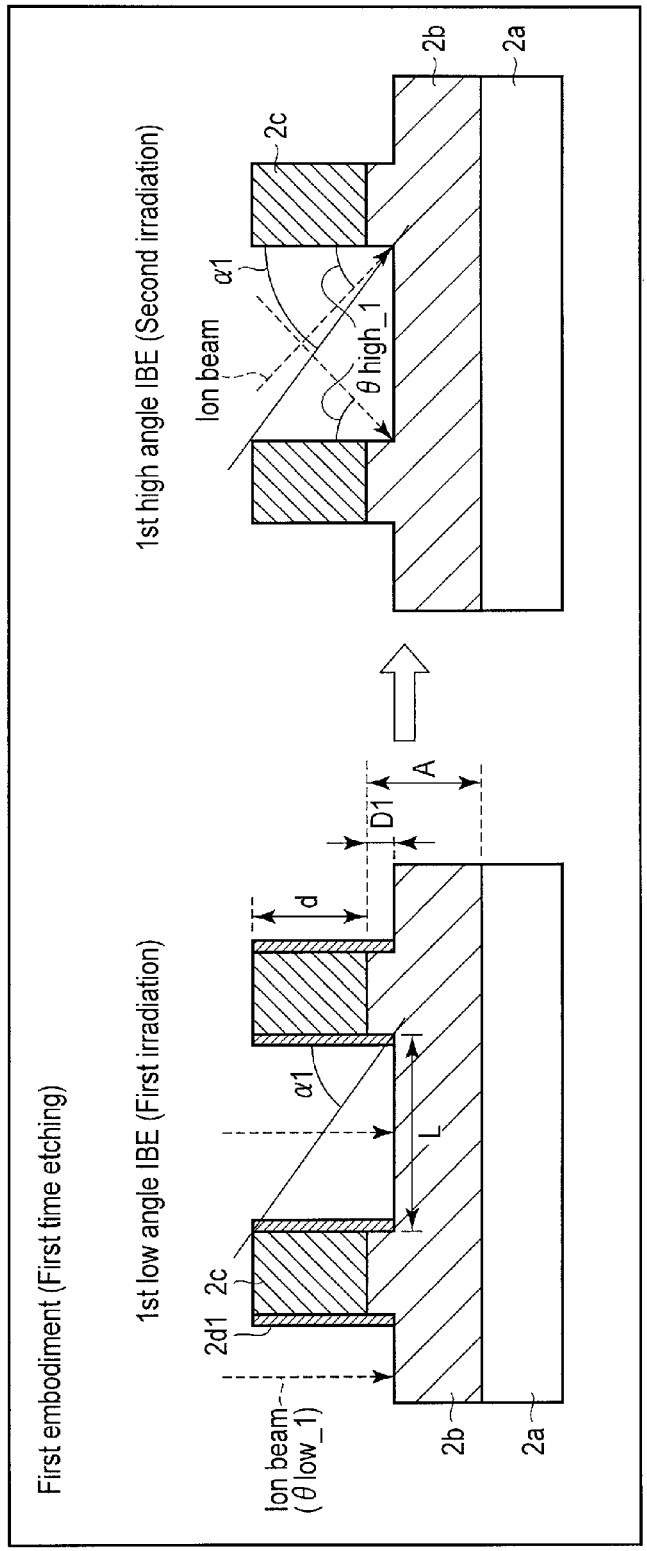
FIG. 4 to FIG. 6 show an etching method according to a first embodiment.
Figure 5:
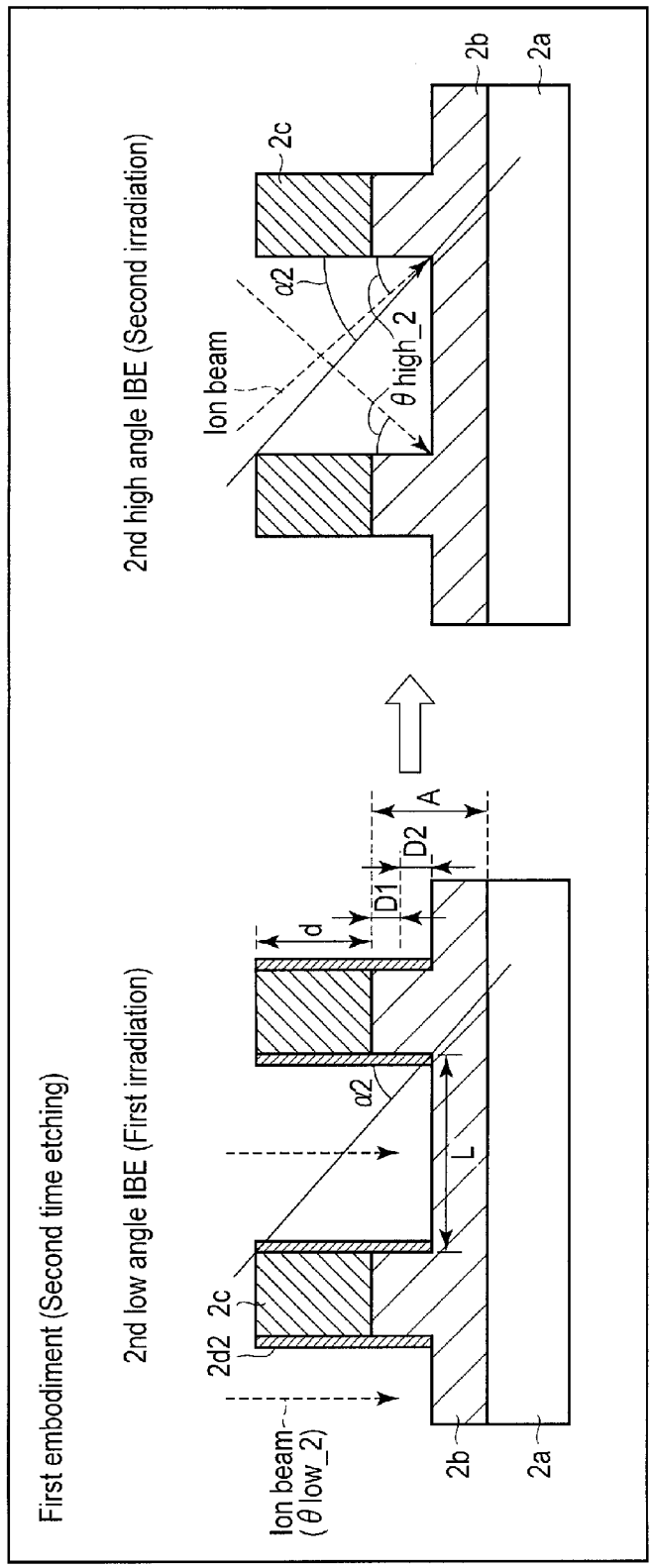
Figure 6:
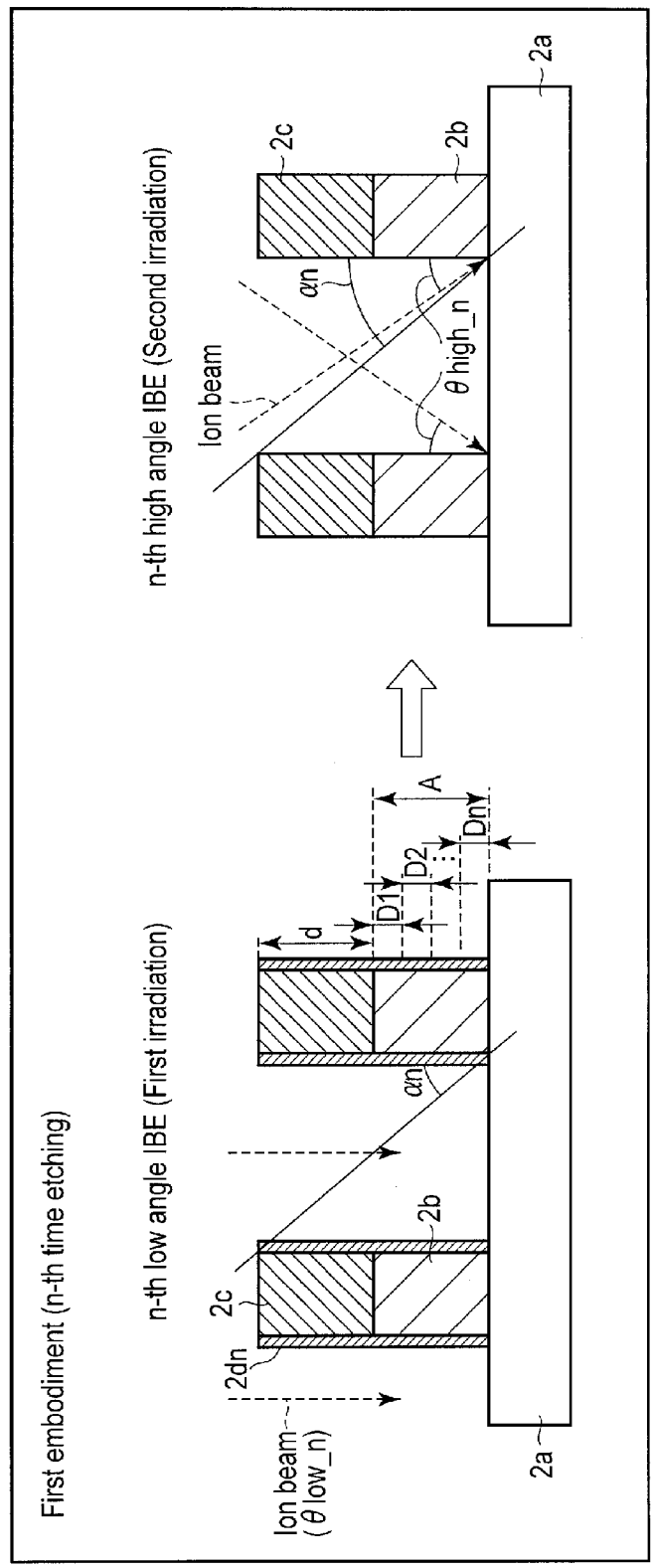

FIG. 4 to FIG. 6 show an etching method according to a first embodiment.

First, as shown in FIG. 4, an etching layer 2*b* having a thickness A is formed on a foundation layer 2*a*. On the etching layer 2*b*, a mask layer (for example, a hard mask layer) 2*c* is formed. Each of the foundation layer 2*a* and the mask layer 2*c* may be a conductive layer or may be an insulating layer. The etching layer 2*b* includes a conductive layer such as a magnetic layer or a metal layer.

Subsequently, a first time etching is performed.

The first time etching comprises a first irradiation (first low angle IBE) and a second irradiation (first high angle IBE) which is performed after the first irradiation.

The first low angle IBE is conducted mainly for the purpose of patterning the etching layer 2*b*. In the first low angle IBE, the etching layer 2*b* is etched by using an ion beam having a beam angle which is low angle θlow_1. θlow_1 is selected from the range of, for example, 0° to 30°. In this example, the ion beam is shown on the assumption that θlow_1=0°.

Since the main purpose of the first low angle IBE is the patterning of the etching layer 2*b*, the beam angle which is low angle θlow_1 is adopted.

However, the ion beam having low angle θlow_1 produces redeposition 2*d*1 of the etching layer 2*b* scattered by the etching on a side wall of the mask layer 2*c*, a side wall of the patterned etching layer 2*b*, etc.

In consideration of the above problem, the first high angle IBE is conducted after the first low angle IBE.

The first high angle IBE is performed mainly for the purpose of patterning the etching layer 2*b* while redeposition 2*d*1 is removed. In the first high angle IBE, redeposition 2*d*1 is eliminated by using an ion beam having a beam angle which is high angle θhigh_1. θhigh_1 is selected from the range of, for example, 30° to 89°, or more preferably, 30° to 60°.

In the first high angle IBE, the following matters should be noted when the etching layer 2*b* is a magnetic layer or a metal layer in a magnetic memory (for example, an MRAM).

For example, as shown in FIG. 4, when the width of the space between the mask layers 2C is L, and the height of the mask layer 2*c* is d, and the etching amount of the etching layer 2*b* by the first low angle IBE (the distance between the upper surface of the exposed etching layer 2*b* and the bottom surface of the mask layer 2*c*) is D1, an acceptable angle α1 is given by $\tan^{-1}(L/(D1+d))$. The beam angle (high angle) θhigh_1 in the first high angle IBE has to be less than or equal to the acceptable angle α1 for the following reason.

When θhigh_1>α1, adjacent mask layers 2*c* serve as walls, thereby leaving a shadow which the ion beam does not reach in the lower edge of the etching layer 2*b*. In this manner, the redeposition in the shadow cannot be removed.

Next, as shown in FIG. 5, a second time etching is performed.

The second time etching comprises, in a manner similar to the first time etching, a first irradiation (second low angle IBE) and a second irradiation (second high angle IBE) which is conducted after the first irradiation.

The second low angle IBE is conducted mainly for the purpose of patterning the etching layer 2*b*. In the second low angle IBE, the etching layer 2*b* is etched by using an ion beam having a beam angle which is low angle θlow_2. θlow_2 is selected from the range of, for example, 0° to 30°. In this example, the ion beam is shown on the assumption that θlow_2=0°.

After the second low angle IBE, the second high angle IBE is performed.

The second high angle IBE is performed mainly for the purpose of patterning the etching layer 2*b* while redeposition 2*d*2 is removed. In the second high angle IBE, redeposition $2d2$ is eliminated by using an ion beam having a beam angle which is high angle θhigh_2. θhigh_2 is selected from the range of, for example, 30° to 89°, or more preferably, 30° to 60°.

In the second high angle IBE, in a manner similar to the first high angle IBE, when the width of the space between the mask layers 2C is L, and the height of the mask layer 2c is d, and the etching amount of the etching layer 2b by the second low angle IBE (the distance between the upper surface of the exposed etching layer 2b and the bottom surface of the mask layer 2c) is D2, an acceptable angle α2 is given by $\tan^{-1}(L/(D1+D2+d))$. As being clear from this equation, when L is constant, α2<α1. The beam angle (high angle) θhigh_2 in the second high angle IBE has to be less than or equal to the acceptable angle α2.

Lastly, as shown in FIG. 6, an $n^{th}$ time etching is performed.

The $n^{th}$ time etching comprises, in a manner similar to the first time etching, a first irradiation ($n^{th}$ low angle IBE) and a second irradiation ($n^{th}$ high angle IBE) which is conducted after the first irradiation.

The $n^{th}$ low angle IBE is conducted mainly for the purpose of patterning the etching layer 2b. In the $n^{th}$ low angle IBE, the etching layer 2b is etched by using an ion beam having a beam angle which is low angle θlow_n. θlow_n is selected from the range of, for example, 0° to 30°. In this example, the ion beam is shown on the assumption that θlow_n=0°.

The patterning of the etching layer 2b is completed by the $n^{th}$ time etching.

After the $n^{th}$ low angle IBE, the $n^{th}$ high angle IBE is performed.

The $n^{th}$ high angle IBE is performed mainly for the purpose of patterning the etching layer 2b while redeposition $2dn$ is removed. In the $n^{th}$ high angle IBE, redeposition $2dn$ is eliminated by using an ion beam having a beam angle which is high angle θhigh_n. θhigh_n is selected from the range of, for example, 30° to 89°, or more preferably, 30° to 60°.

In the $n^{th}$ high angle IBE, in a manner similar to the first high angle IBE, when the width of the space between the mask layers 2C is L, and the height of the mask layer 2c is d, and the etching amount of the etching layer 2b by the $n^{th}$ low angle IBE (the distance between the upper surface of the exposed etching layer 2b and the bottom surface of the mask layer 2c) is Dn, an acceptable angle αn is given by $\tan^{-1}(L/(D\_sum+d))$, where D_sum is the distance between the upper surface of the exposed etching layer 2b and the bottom surface of the mask layer 2c, or in other words, the sum (D1+D2+ . . . +Dn) of the etching amount of the etching layer 2b. The beam angle (high angle) θhigh_n in the $n^{th}$ high angle IBE has to be less than or equal to the acceptable angle αn.

The patterning of the etching layer 2b is completed by the $n^{th}$ time etching. Therefore, D_sum is greater than or equal to the thickness A of the etching layer 2b.

The amount of the redeposition which is produced by the combination of the low angle IBE and the high angle IBE in each etching time n in this embodiment is very small compared with the amount of the redeposition which is produced when all of the etching layers are patterned by one-time etching.

Therefore, in each etching time n, the redeposition produced by the low angle IBE can be easily removed by the high angle IBE.

In particular, the larger the ion beam angle is, the more easily the redeposition can be removed. However, the acceptable angle αn in the $n^{th}$ time etching shown in FIG. 6 is less than the acceptable angle α1 in the first time etching. For this reason, for example, the removal of redeposition $2dn$ in the $n^{th}$ time etching is more difficult than the removal of redeposition $2d1$ in the first time etching.

Even in such a case, the whole redeposition $2dn$ can be easily removed by the $n^{th}$ high angle IBE since the amount of the redeposition produced by the $n^{th}$ low angle IBE is small in the $n^{th}$ time etching in the present embodiment as explained above.

In the first embodiment, it is possible to omit the first irradiation (first low angle IBE) in the first time etching and the second irradiation ($n^{th}$ high angle IBE) in the $n^{th}$ time etching. Even in this case, the amount of redeposition can be reduced by shortening the time of the second irradiation in the $n^{th}$ time etching.

FIG. 7 shows a comparative example of the etching method.

In this example, the whole etching layer 2b is patterned by one-time etching. In this case, the amount of redeposition $2d$ produced by the low angle IBE is very large. The acceptable angle α is the same as the acceptable angle αn shown in FIG. 6. Thus, the beam angle (high angle) θhigh is the same as the beam angle (high angle) θhigh_n shown in FIG. 6.

In this manner, in the low angle IBE, the etching layer 2b has a trapezoidal shape in which the bottom portion is broadened, and the amount of redeposition $2d$ is large. In the high angle IBE, it is difficult to eliminate redeposition $2d$ in the bottom portion of the etching layer 2b.

(2) Second Embodiment

Figure 9:
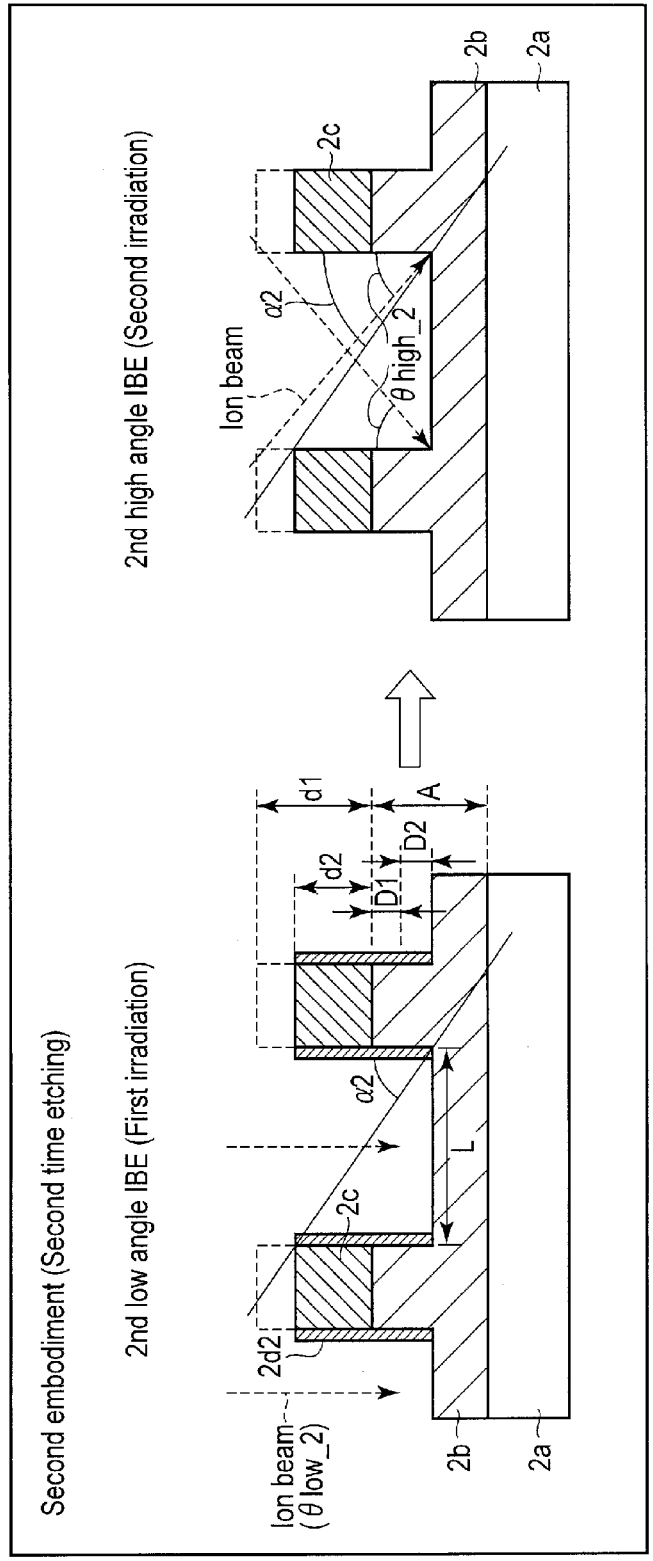
Figure 10:
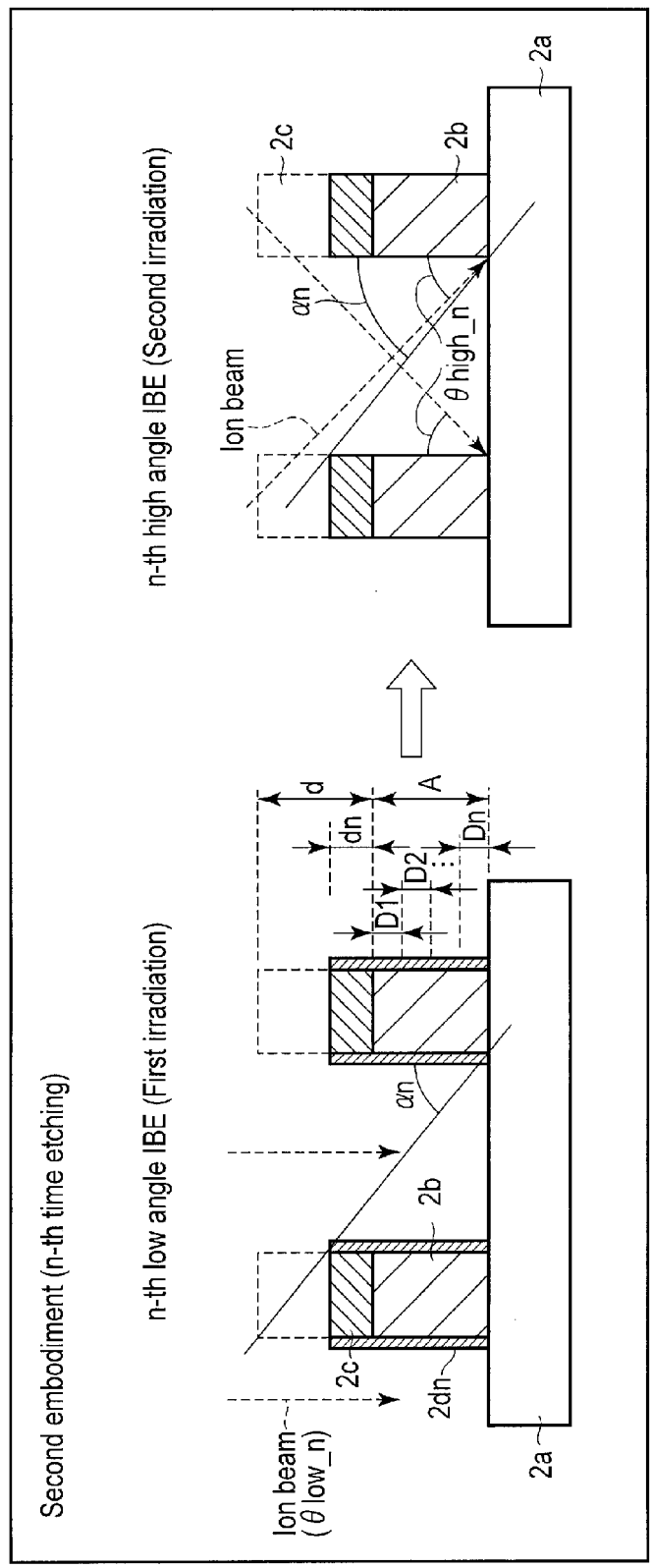

FIG. 8 to FIG. 10 show an etching method according to a second embodiment.

Compared to the first embodiment, the second embodiment features the following point: as the etching time n is increased, the thickness of a mask layer 2c is gradually reduced.

For example, the etching selection ratio of the etching layer and the mask layer in the second embodiment has to be less than the ratio in the first embodiment. This case has the advantage that the acceptable angles α2, . . . , αn of ion beams in and after the second time etching are larger than the angles in the first embodiment.

First, as shown in FIG. 8, an etching layer 2b having a thickness A is formed on a foundation layer 2a. On the etching layer 2b, the mask layer (for example, a hard mask layer) 2c is formed.

Subsequently, a first time etching is performed.

The first time etching comprises a first irradiation (first low angle IBE) and a second irradiation (first high angle IBE) which is performed after the first irradiation.

The first low angle IBE is conducted mainly for the purpose of patterning the etching layer 2b. In the first low angle IBE, the etching layer 2b is etched by using an ion beam having a beam angle which is low angle θlow_1.

In a manner similar to the first embodiment, the first low angle IBE produces redeposition $2d1$ on a side wall of the mask layer 2c, a side wall of the patterned etching layer 2b, etc.

In consideration of the above problem, the first high angle IBE is conducted after the first low angle IBE.

The first high angle IBE is performed mainly for the purpose of patterning the etching layer 2b while redeposition $2d1$ is removed. In the first high angle IBE, redeposition $2d1$ is eliminated by using an ion beam having a beam angle which is high angle θhigh_1.

In the first high angle IBE, when the etching layer 2b is a magnetic layer or a metal layer in a magnetic memory (for example, an MRAM), an acceptable angle α1 is given by $\tan^{-1}(L/(D1+d1))$, where L is the width of the space between the mask layers 2C, and d1 is the height of the mask layer 2c, and D1 is the etching amount of the etching layer 2b by the first low angle IBE (the distance between the upper surface of the exposed etching layer 2b and the bottom surface of the mask layer 2c).

The beam angle (high angle) θhigh_1 in the first high angle IBE has to be less than or equal to the acceptable angle α1.

Next, as shown in FIG. 9, a second time etching is performed.

The second time etching comprises, in a manner similar to the first time etching, a first irradiation (second low angle IBE) and a second irradiation (second high angle IBE) which is conducted after the first irradiation.

The second low angle IBE is conducted mainly for the purpose of patterning the etching layer 2b. In the second low angle IBE, the etching layer 2b is etched by using an ion beam having a beam angle which is low angle θhigh_2.

After the second low angle IBE, the second high angle IBE is performed.

The second high angle IBE is conducted mainly for the purpose of patterning the etching layer 2b while redeposition 2d2 is removed. In the second high angle IBE, redeposition 2d2 is eliminated by using an ion beam having a beam angle which is high angle θhigh_2.

In the second high angle IBE, in a manner similar to the first high angle IBE, when the etching layer 2b is a magnetic layer or a metal layer in a magnetic memory (for example, an MRAM), an acceptable angle α2 is given by $\tan^{-1}(L/(D1+D2+d2))$, where L is the width of the space between the mask layers 2C, and d2 is the height of the mask layer 2c. In addition, d2<d1.

The beam angle (high angle) θhigh_2 in the first high angle IBE has to be less than or equal to the acceptable angle α2.

Lastly, as shown in FIG. 10, an $n^{th}$ time etching is performed.

The $n^{th}$ time etching comprises, in a manner similar to the first time etching, a first irradiation ($n^{th}$ low angle IBE) and a second irradiation ($n^{th}$ high angle IBE) which is conducted after the first irradiation.

The $n^{th}$ low angle IBE is conducted mainly for the purpose of patterning the etching layer 2b. In the $n^{th}$ low angle IBE, the etching layer 2b is etched by using an ion beam having a beam angle which is low angle θlow_n.

The patterning of the etching layer 2b is completed by the $n^{th}$ time etching.

After the $n^{th}$ low angle IBE, the $n^{th}$ high angle IBE is performed.

The $n^{th}$ high angle IBE is performed mainly for the purpose of patterning the etching layer 2b while redeposition 2dn is removed. In the $n^{th}$ high angle IBE, redeposition 2dn is eliminated by using an ion beam having a beam angle which is high angle θhigh_n.

In the $n^{th}$ high angle IBE, in a manner similar to the first high angle IBE, when the etching layer 2b is a magnetic layer or a metal layer in a magnetic memory (for example, an MRAM), an acceptable angle αn is given by $\tan^{-1}(L/(D\_sum+dn))$, where L is the width of the space between the mask layers 2C, and dn is the height of the mask layer 2c, and D_sum is the distance between the upper surface of the exposed etching layer 2b and the bottom surface of the mask layer 2c, or in other words, the sum (D1+D2+ . . . +Dn) of the etching amount of the etching layer 2b by the first to $n^{th}$ low angle IBE. In addition, dn< . . . <d2<d1. The beam angle (high angle) θhigh_n in the first high angle IBE has to be less than or equal to the acceptable angle αn.

The patterning of the etching layer 2b is completed by the $n^{th}$ time etching. Therefore, D_sum is greater than or equal to the thickness A of the etching layer 2b.

In a manner similar to the first embodiment, the amount of the redeposition which is produced by the combination of the low angle IBE and the high angle IBE in each etching time n in the present embodiment is very small compared to the amount of the redeposition which is produced when all of the etching layers are patterned by one-time etching.

Therefore, in each etching time n, the redeposition produced by the low angle IBE can be easily removed by the high angle IBE.

In each etching time n, the mask layer 2c is etched little by little. Therefore, it is possible to enlarge the acceptable angles α2, . . . , αn of ion beams in and after the second time etching.

In this manner, in each etching time n, the whole redeposition can be easily removed by the high angle IBE.

In the second embodiment, in a manner to similar to the first embodiment, it is possible to omit the first irradiation (first low angle IBE) in the first time etching and the second irradiation ($n^{th}$ high angle IBE) in the $n^{th}$ time etching.

Figure 11:
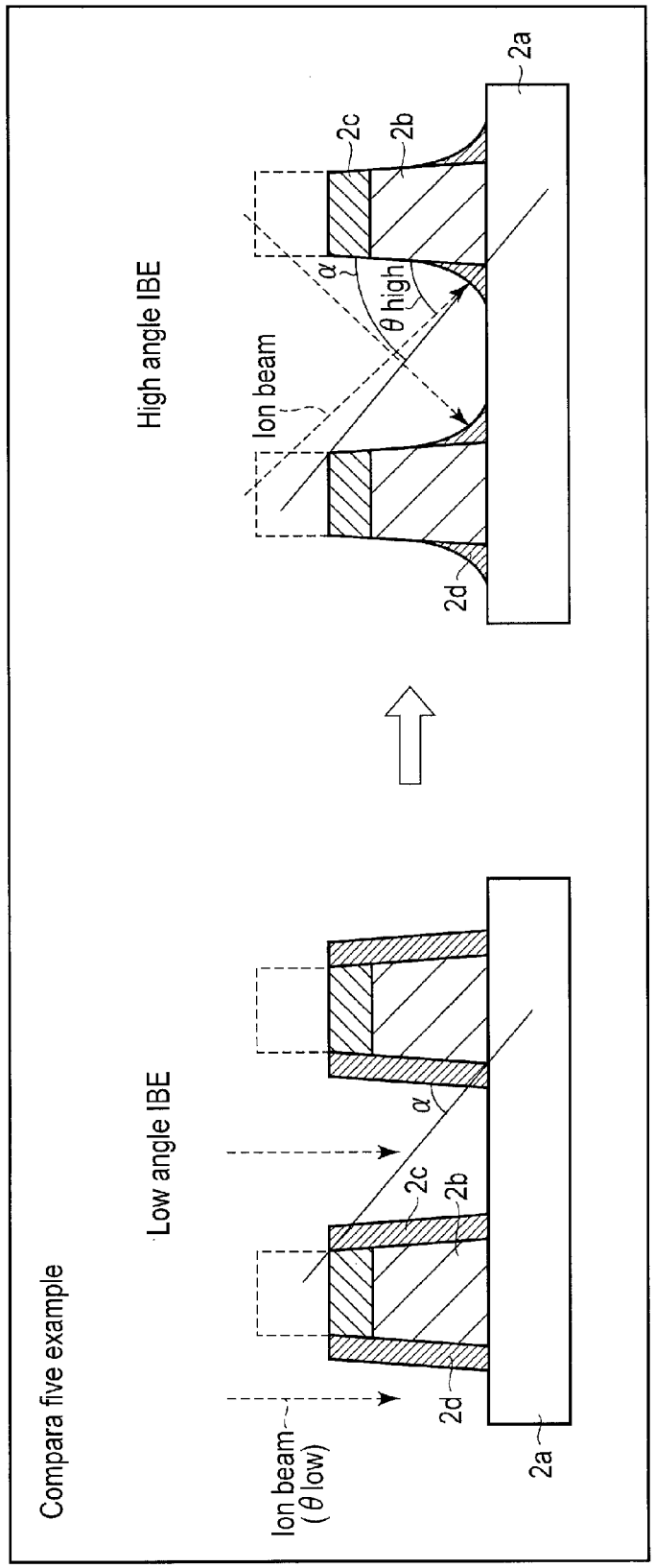
FIG. 11 shows a comparative example of the etching method.

FIG. 11 shows a comparative example of the etching method.

In this example, all of the etching layers 2b are patterned by one-time etching. In this case, in the low angle IBE, the etching layer 2b has a trapezoidal shape in which the bottom portion is broadened, and the amount of redeposition 2d is large. In the high angle IBE, it is difficult to eliminate redeposition 2d in the bottom portion of the etching layer 2b.

(3) Third Embodiment

This embodiment is related to the relationship between the etching amount in the low angle IBE (first irradiation) and the beam angle (high angle) in the high angle IBE (second irradiation) in each etching time n in the first and second embodiments.

First Example

Etching Amount: D1=D2= . . . =Dn
Beam Angle (Low Angle): No Limitation
Beam Angle (High Angle): θhigh_1=θhigh_2= . . . =θhigh_n This is a basic example. The conditions in each etching time n are set to be identical such that the final pattern to be obtained can be easily predicted.

The beam angle (low angle) is not particularly limited. However, the beam angle is preferably set as θlow_1=θlow_2= . . . =θlow_n.

Second Example

Etching Amount: D1>D2> . . . >Dn
Beam Angle (Low Angle): No Limitation
Beam Angle (High Angle): θhigh_1<θhigh_2< . . . <θhigh_n This example is particularly advantageous to a case where the etching selection ratio of the etching layer and the mask layer is small (the second embodiment). In this case, in each etching time n, the sum (d+D_sum) of the height d (one of d1, d2, . . . , dn) of the mask layer and the sum (D_sum) of the etching amount of the etching layer does not largely change for the following reason: as the number of etching times is advanced, d is gradually reduced, but D_sum is gradually increased.

In consideration of the above factor, in early stages of etching times n, the etching amount in the low angle IBE is set to be large for the purpose of advancing the patterning as fast as possible. In late stages of etching times n, the beam angle (high angle) in the high angle IBE is set to be large for the purpose of surely removing the redeposition.

The beam angle (low angle) is not particularly limited. However, the beam angle is preferably set as θlow_1=θlow_2= . . . =θlow_n.

Third Example

Etching Amount: D1>D2> . . . >Dn
Beam Angle (Low Angle): No Limitation
Beam Angle (High Angle): θhigh_1>θhigh_2> . . . >θhigh_n This example is particularly advantageous to a case where the etching selection ratio of the etching layer and the mask layer is large (the first embodiment). In this case, in late stages of etching times n, the sum (d+D_sum) of the height d of the mask layer (substantially constant) and the sum (D_sum) of the etching amount of the etching layer is large. For this reason, in late stages of etching times n, the beam angle (high angle) in the high angle has to be small.

Therefore, in early stages of etching times n, the etching amount in the low angle IBE is set to be large, and the beam angle (high angle) in the high angle IBE is set to be large, for the purpose of advancing the patterning as fast as possible and surely removing the redeposition. In late stages of etching times n, the etching amount in the low angle IBE is set to be small for the purpose of reducing the production of redeposition.

The beam angle (low angle) is not particularly limited. However, the beam angle is preferably set as θlow_1=θlow_2= . . . =θlow_n.

In the third embodiment, it is possible to omit the first irradiation (first low angle IBE) θlow_1 in the first time etching, and the second irradiation ($n^{th}$ high angle IBE) $θ_{high\_n}$ in the $n^{th}$ time etching.

3. Magnetic Memory

This specification explains an example of a magnetic memory which can be manufactured by the above-described etching apparatus or etching method.

Figure 12:
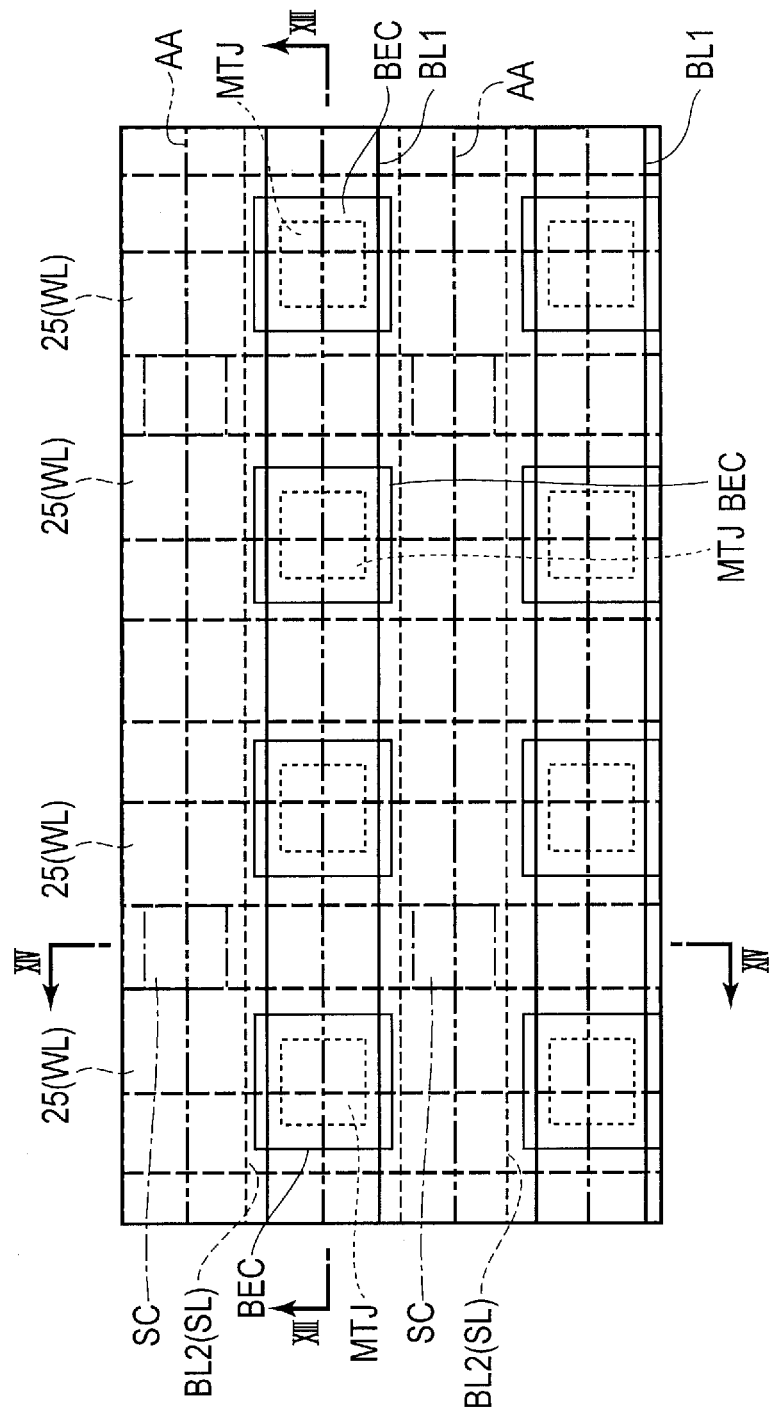
FIG. 12 shows a memory cell of an MRAM as an application example.

FIG. 12 to FIG. 14 show a memory cell of an MRAM as an application example. FIG. 12 is a plan view of the memory cell of the MRAM. FIG. 13 is a cross-sectional view taken along line XIII-XIII of FIG. 12. FIG. 14 is a cross-sectional view taken along line XIV-XIV of FIG. 12.

In this example, the memory cell of the magnetic memory comprises a select transistor (for example, an FET) ST and a magnetoresistive element MTJ.

The select transistor ST is provided in an active area AA in a semiconductor substrate 21. The active area AA is surrounded by an element separation insulating layer 22 in the semiconductor substrate 21. In this example, the element separation insulating layer 22 has a shallow trench isolation (STI) structure.

The select transistor ST comprises source/drain diffusion layers 23a and 23b in the semiconductor substrate 21, a gate insulating layer 24 and a gate electrode (word line) 25. The gate insulating layer 24 and the gate electrode (word line) 25 are formed between source/drain diffusion layers 23a and 23b in the semiconductor substrate 21. In this example, the select transistor ST has a buried gate structure in which the gate electrode 25 is buried in the semiconductor substrate 21.

An interlayer insulating layer (for example, a silicon oxide layer) 26 covers the select transistor ST. Contact plugs BEC and SC are provided in the interlayer insulating layer 26. Contact plug BEC is connected to source/drain diffusion layer 23a. Contact plug SC is connected to source/drain diffusion layer 23b. Contact plugs BEC and SC include, for example, one of W, Ta, Ru and Ti.

The magnetoresistive element MTJ is provided on contact plug BEC. Contact plug TEC is provided on the magnetoresistive element MTJ.

Bit line BL1 is connected to the magnetoresistive element MTJ via contact plug TEC. Bit line BL2 is connected to source/drain diffusion layer 23b via contact plug SC. Bit line BL2 also functions as, for example, a source line SL to which a ground potential is applied at the time of reading.

FIG. 15 shows an example of the magnetoresistive element MTJ of FIG. 12 to FIG. 14.

In FIG. 15, elements identical to those of FIG. 12 to FIG. 14 are designated by the same reference numbers.

The magnetoresistive element MTJ comprises shift cancelling layer SCL (11), a first metal layer 12 on shift cancelling layer SCL (11), a second metal layer 13 on the first metal layer 12, a first magnetic layer 14a on the second metal layer 13, a nonmagnetic insulating layer (tunnel barrier layer) 14b on the first magnetic layer 14a, a second magnetic layer 14c on the nonmagnetic insulating layer 14b, a nonmagnetic conductive layer 15 on the second magnetic layer 14c, shift cancelling layer SCL (16) on the nonmagnetic conductive layer 15, and a third metal layer 17 on shift cancelling layer SCL (16).

The first metal layer 12 includes, for example, one of Al, Be, Mg, Ca, Sr, Ba, Sc, Y, La, Zr and Hf. The second metal layer 13 includes, for example, a chemical compound such as HfB, MgAlB, HfAlB, ScAlB, ScHfB or HfMgB.

The third metal layer 17 functions as, for example, a mask layer (hard mask layer) when the magnetoresistive element MTJ is processed. The third metal layer 17 includes, for example, W, Ta, Ru, Ti, TaN, Ti or N. The third metal layer 17 preferably has a material which is low in electric resistance and is excellent in diffusion resistance, etching resistance and milling resistance, such as a lamination of Ta/Ru.

One of the first and second magnetic layers 14a and 14c is a reference layer having an invariable magnetization, and the other one is a storage layer having a variable magnetization.

Invariable magnetization means that the magnetization direction before and after writing is the same. Variable magnetization means that the magnetization direction before writing may change to the opposite direction after writing.

Writing refers to spin transfer writing which applies spin torque to the magnetization of the storage layer by supplying a spin injection current (spin-polarized electrons) to the magnetoresistive element MTJ.

When the first magnetic layer 14a is a storage layer, and the second magnetic layer 14c is a reference layer, the magnetoresistive element MTJ is called a top-pin type. FIG. 17A and FIG. 17B show magnetization states of the top-pin type magnetoresistive element MTJ. When the first magnetic layer 14a is a reference layer, and the second magnetic layer 14c is a storage layer, the magnetoresistive element MTJ is called a bottom-pin type. FIG. 18A and FIG. 18B show magnetization states of the bottom-pin type magnetoresistive element MTJ.

Each of the first and second magnetic layers 14a and 14c preferably has a perpendicular magnetization, or in other words, a remnant magnetization in a perpendicular direction in which the first and second magnetic layers 14a and 14c are stacked. FIG. 17A and FIG. 18A show magnetization states of the perpendicular-magnetization type magnetoresistive element MTJ. Each of the first and second magnetic layers 14a and 14c may have an in-plane magnetization, or in other words, a remnant magnetization in an in-plane direction perpendicular to the direction in which the first and second magnetic layers 14a and 14c are stacked. FIG. 17B and FIG. 18B show magnetization states of the in-plane-magnetization type magnetoresistive element MTJ.

The resistance of the magnetoresistive element MTJ changes depending on the relative magnetization directions of the storage layer and the reference layer by the magnetoresistive effect. For example, when the magnetization directions of the storage layer and the reference layer are the same (this state is referred to as a parallel state), the resistance of the magnetoresistive element MTJ is low. When the magnetization directions of the storage layer and the reference layer are opposite (this state is referred to as an anti-parallel state), the resistance of the magnetoresistive element MTJ is high.

The first and second magnetic layers 14a and 14c comprises, for example, CoFe, MgFeO, or a lamination of them. When the magnetoresistive element has a perpendicular magnetization, the first and second magnetic layers 14a and 14c preferably comprise, for example, TbCoFe having a perpendicular magnetic anisotropy, an artificial lattice in which Co and Pt are stacked, or L1o-ordered FePt. In this case, CoFeB may be provided as an interface layer between the first magnetic layer 14a and the nonmagnetic insulating layer 14b or between the nonmagnetic insulating layer 14b and the second magnetic layer 14c.

The nonmagnetic insulating layer 14b comprises, for example, MgO or AlO. The nonmagnetic insulating layer 14b may be a nitride of, for example, Al, Si, Be, Mg, Ca, Sr, Ba, Sc, Y, La, Zr or Hf.

In this example, the device structure is a double shift cancelling structure in which shift cancelling layers SCL (11, 16) are present in the upper and lower portions of the magnetoresistive element MTJ. However, one of shift cancelling layers SCL (11, 16) may be omitted.

When shift cancelling layer SCL (11) is omitted, the structure is a top-shift cancelling structure in which shift cancelling layer SCL (16) is present in the upper portion of the magnetoresistive element MTJ. When shift cancelling layer SCL (16) is omitted, the structure is a bottom-shift cancelling structure in which shift cancelling layer SCL (11) is present in the lower portion of the magnetoresistive element MTJ.

Each of shift cancelling layers SCL (11, 16) preferably comprises, for example, a structure of [Co/Pt]n, in which Co and Pt layers are stacked n times.

Shift cancelling layers SCL (11, 16) have a magnetization direction opposite to the magnetization direction of the reference layer. This structure enables shift cancelling layers SCL (11, 16) to cancel the shift of the magnetization inversion property (hysteresis curve) of the storage layer by the stray magnetic field from the reference layer.

Redeposition 18 is formed on a side wall of the magnetoresistive element MTJ. Redeposition 18 is insulated to prevent the electrical short failure of the first and second magnetic layers 14a and 14c. A spacer layer 19 covers redeposition 18. The spacer layer 19 comprises an insulating layer formed of, for example, an oxide or a nitride.

A protective layer PL covers the whole magnetoresistive element MTJ. The protective layer PL preferably comprises a layer configured to block oxygen; for example, preferably has a nitride such as SiN, AlN or HfN.

The above-described magnetoresistive element MTJ is patterned by, for example, a semi-side wall process. This process is advantageous to the realization of both of the prevention of the electrical short failure and the improvement of the MR ratio of the magnetoresistive element MTJ.

In this case, for example, while the third metal layer 17 is used as a mask, IBE is applied to the extent that the first metal layer 12 is partway etched. Subsequently, the spacer layer 19 is added. The spacer layer 19 and the third metal layer 17 are used as masks in order to apply IBE to the extent that shift cancelling layer SCL (11) is etched.

However, particularly in the latter etching, for example, as shown in FIG. 16, redeposition 20 from shift cancelling layer SCL (11) is produced since the thickness of shift cancelling layer SCL (11) is large. This redeposition has a harmful influence on the characteristics of the magnetoresistive element MTJ. It is necessary to prevent the production of redeposition 20.

Use of the etching apparatus and the etching method in the embodiments explained above enable shift cancelling layer SCL (11) to be patterned without producing redeposition 20 shown in FIG. 16 in the etching of shift cancelling layer SCL (11).

The mechanism is explained in detail below.

4. Method of Manufacturing Magnetic Memory

This specification explains a method for manufacturing the magnetic memory comprising the magnetoresistive element shown in FIG. 12 to FIG. 15.

Figure 19:
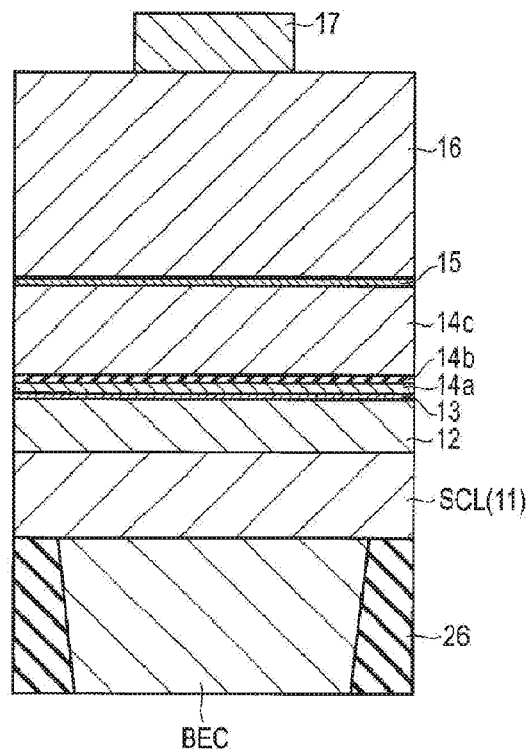

First, a lamination structure is formed by, for example, a chemical vapor deposition (CVD) process as shown in FIG. 19. In the lamination structure, shift cancelling layer SLC (11), the first metal layer 12, the second metal layer 13, the first magnetic layer 14a, the nonmagnetic insulating layer 14b, the second magnetic layer 14c, the nonmagnetic conductive layer 15 and shift cancelling layer SCL (16) are stacked on contact plug BEC in the interlayer insulating layer 26. Subsequently, the third metal layer 17 is formed as a mask layer on shift cancelling layer SCL (16) by, for example, the CVD process and a photo engraving process (PEP).

Figure 20:
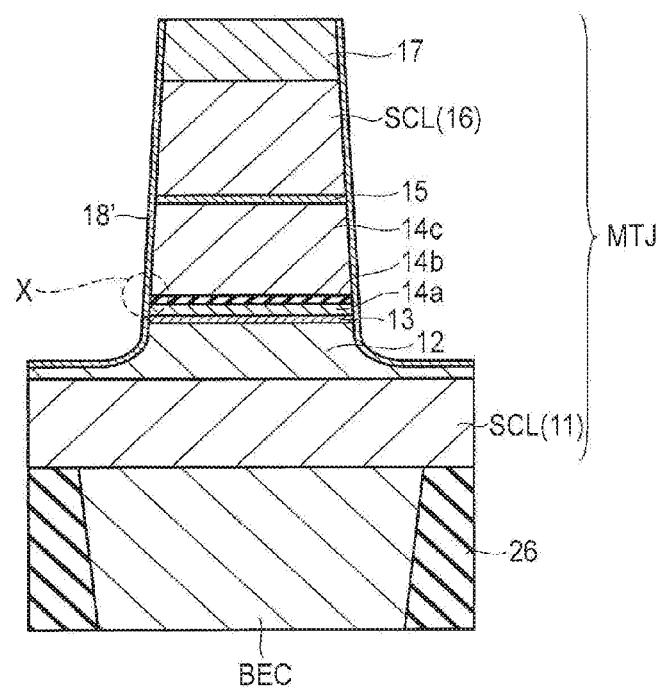

Next, a first etching process is performed as shown in FIG. 20.

The first etching process is executed by, for example, ion beam etching (IBE). The first etching process is performed for the purpose of etching the magnetoresistive element MTJ, the second metal layer 13 and the first metal layer 12 while the third metal layer 17 is used as a mask.

In this case, the shape of the magnetoresistive element MTJ can be close to the ideal shape since the magnetoresistive element MTJ is patterned by one-time etching. In a direction parallel to the upper surface of the first metal layer 12, the width of the first and second magnetic layers 14a and 14c can be made substantially the same in a portion X which contacts the nonmagnetic insulating layer 14b. In this manner, the variation in the MR ratio of the magnetoresistive element MTJ can be reduced.

The first etching process is stopped in the middle of the first metal layer 12 for the following reasons.

In the first etching process, for example, the magnetoresistive element MTJ is patterned while redeposition 18' attached to a side wall of the magnetoresistive element MTJ in the etching is removed by controlling the beam angle and energy of ion beam.

In the first etching process, it is difficult to completely eliminate redeposition 18' of the metal layer which is lastly etched.

For example, if the first etching process is applied until the interlayer insulating layer 26 is exposed, the metal layer which is lastly etched might be contact plug BEC. Contact plug BEC contains a metal which is difficult to be oxidized (for example, W, Ta, Ru or Ti). If such a metal is reattached to a side wall of the magnetoresistive element MTJ, thereby producing redeposition 18', it is difficult to completely insulate redeposition 18' by oxidation. As a result, an electrical short failure is caused in the first and second magnetic layers 14a and 14c.

In consideration of the above problem, in this example, the metal layer which is lastly etched in the first etching process is the first metal layer 12 containing a metal which is easily oxidized (for example, Al, Be, Mg, Ca, Sr, Ba, Sc, Y, La, Zr or Hf). Specifically, as stated above, the first etching process is stopped in the middle of the first metal layer 12.

In this case, even if the metal which is easily oxidized in the first metal layer 12 is reattached to a side wall of the magnetoresistive element MTJ, thereby producing redeposition 18', it is possible to completely insulate redeposition 18' by oxidation. Therefore, it is possible to prevent the electrical short failure of the first and second magnetic layers 14a and 14c.

Subsequently, redeposition 18' is converted into an oxide by oxidation (for example, thermal oxidation). As a result, as shown in FIG. 21, redeposition 18 containing the oxide of the metal which is easily oxidized is formed in a side wall of the magnetoresistive element MTJ.

Next, as shown in FIG. 22, the spacer layer 19 covering redeposition 18 is formed by CVD and RIE. The spacer layer 19 comprises, for example, a silicon oxide or a silicon nitride.

The spacer layer 19 has a width which is at least greater than the width of redeposition 18 (for example, 1 nm) in a direction parallel to the upper surface of the first metal layer 12 in order to function as a mask layer. For example, the spacer layer 19 preferably has a width which is greater than 1 nm and less than 10 nm in the direction parallel to the upper surface of the first metal layer 12.

Redeposition 18 is shown as a layer in the drawings. However, in practice, redeposition 18 is attached to a side wall of the magnetoresistive element MTJ based on a unit of several atoms. Thus, the width of redeposition 18 refers to the thickest portion of redeposition 18.

Next, as shown in FIG. 23 to FIG. 25, a second etching process is performed.

In a manner similar to the first etching process, the second etching process is performed by, for example, IBE. The second etching process is executed for the purpose of etching shift cancelling layer SCL (11) while the third metal layer 17 and the spacer layer 19 are used as masks.

The second etching process is conducted until the interlayer insulating layer 26 which is the foundation of shift cancelling layer SCL (11) is exposed. This is because the magnetic memory comprises an array of a plurality of magnetoresistive elements MTJ. It is possible to electrically separate the plurality of magnetoresistive elements MTJ in the magnetic memory from each other by etching shift cancelling layer SCL (11) to the last.

In the second etching process, shift cancelling layer SCL (11) which is relatively thick has to be etched. If this etching is done by one-time etching, a large amount of redeposition 20 is produced. It is difficult to remove or insulate redeposition 20.

When the etching method in the present embodiment is applied to the second etching process, shift cancelling layer SCL (11) can be patterned while redeposition 20 is surely removed. Further, when the etching method in the present embodiment is applied, it is possible to certainly eliminate the redeposition of contact plug (a metal which is difficult to be oxidized) BEC which is lastly etched in the second etching process.

For example, as shown in FIG. 23, a low angle IBE process which irradiates an ion beam having a beam angle θlow is performed in order to apply a patterning process to the extent that shift cancelling layer SCL (11) is partway etched. At this time, redeposition 20 of an element contained in shift cancelling layer SCL (11) is produced. Redeposition 20 shown in FIG. 23 is removed by performing a high angle IBE process which irradiates an ion beam having a beam angle θhigh after the low angle IBE process as shown in FIG. 24. The low angle IBE and high angle IBE processes are repeated n times (n is a natural number).

As a result, as shown in FIG. 25, the second etching process which patterns shift cancelling layer SCL (11) is finished.

Subsequently, as shown in FIG. 25, the protective layer PL which covers the magnetoresistive element MTJ is formed by CVD.

Figure 26:
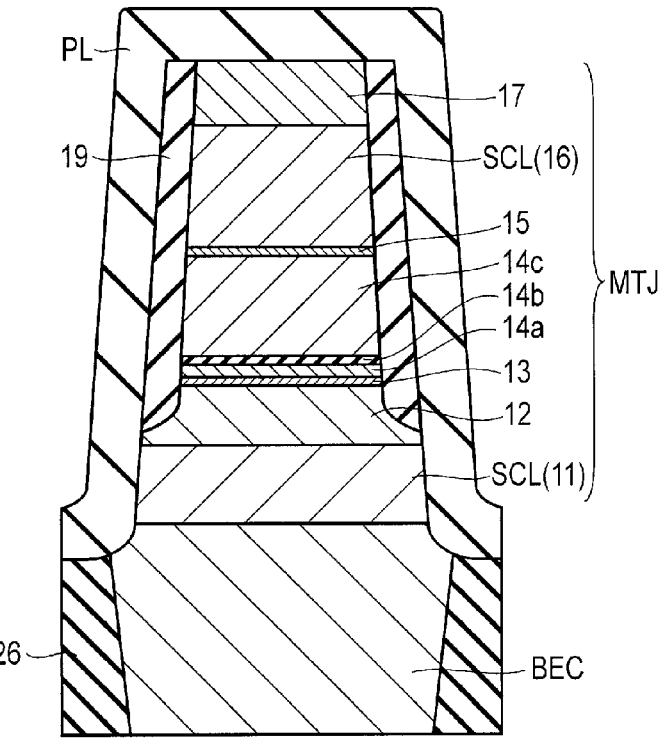
Figure 27:
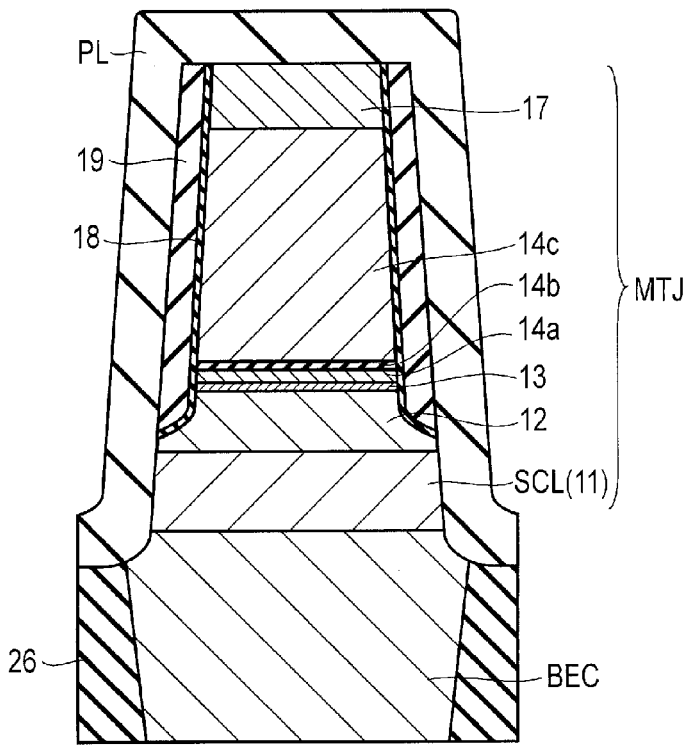

As shown in FIG. 26, redeposition 18 can be completely eliminated or can be very small depending on the conditions of the first etching process. As shown in FIG. 27, shift cancelling layer SCL may be provided on only the lower side of the magnetoresistive element MTJ.

The magnetic memory comprising the magnetoresistive element MTJ in FIG. 12 to FIG. 15 is manufactured by the above method.

5. Conclusion

According to an embodiment, a magnetic layer or a metal layer is patterned by repeating the etching of the magnetic layer or the metal layer and the removal of the redeposition caused by the etching. Therefore, with respect to the final pattern of the magnetic layer or the metal layer, the redeposition can be vanishingly removed. Thus, it is possible to improve the characteristics of an element including a magnetic layer or a metal layer, such as a magnetoresistive element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An etching method comprising:
   forming a metal layer on an etching layer, the etching layer comprising a first shift cancelling layer, a first magnetic layer, a nonmagnetic layer, a second magnetic layer, and a second shift cancelling layer which are stacked in that order;
   executing a first irradiation to etch the etching layer using the metal layer as an etching mask, the executing the first irradiation comprising irradiating the etching layer with an ion beam with a beam angle having a first value, the beam angle being an angle between a direction which is perpendicular to an upper surface of the etching layer and a direction in which the ion beam is irradiated;

after executing the first irradiation, executing a second irradiation to etch the etching layer using the metal layer as the etching mask, the executing the second irradiation comprising irradiating the etching layer with the ion beam with the beam angle having a second value that is different from the first value; and after executing the second irradiation, forming a protective layer over (i) the metal layer used as the etching mask and (ii) the etching layer.

2. The method of claim 1, further comprising:
executing the first and second irradiations n-times repeatedly, where n is a natural number.

3. The method of claim 1, wherein the ion beam includes one of Ne, Ar, Kr, Xe, $N_2$ and $O_2$.

4. The method of claim 1, wherein the first value is smaller than the second value.

5. The method of claim 1, wherein the first value is selected from a range between 0° and 30°.

6. The method of claim 1, wherein the second value is selected from a range between 30° and 60°.

7. The method of claim 1, wherein the beam angle changes from the first value to the second value discontinuously.

8. The method of claim 1, wherein the beam angle changes from the first value to the second value continuously.

9. The method of claim 1, wherein
the first and second irradiations satisfy the following condition:

$$\theta=\tan^{-1}(L/(D\_sum+d)),$$

where $\theta$ denotes the beam angle, L denotes a width of a space where the metal layer does not cover the etching layer, $D\_sum$ denotes a height between a top surface and a bottom surface of the etching layer, and d denotes a height of the metal layer.

10. The method of claim 1, wherein the first shift cancelling layer, the first magnetic layer, the nonmagnetic layer, the second magnetic layer, and the second shift cancelling layer constitute a magnetic memory.

11. The method of claim 10, wherein the magnetic memory includes a first magnetoresistive element, and a second magnetoresistive element next to the first magnetoresistive element.

* * * * *